(12) United States Patent
Cho

(10) Patent No.: US 9,305,927 B2
(45) Date of Patent: Apr. 5, 2016

(54) SEMICONDUCTOR DEVICE AND METHOD OF MANUFACTURING THE SAME

(71) Applicant: SK HYNIX INC., Icheon (KR)

(72) Inventor: Chul Hwan Cho, Cheongju (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/450,139

(22) Filed: Aug. 1, 2014

(65) Prior Publication Data

US 2014/0342540 A1 Nov. 20, 2014

Related U.S. Application Data

(62) Division of application No. 13/346,829, filed on Jan. 10, 2012, now Pat. No. 8,823,086.

(30) Foreign Application Priority Data

May 11, 2011 (KR) .................. 10-2011-0044205

(51) Int. Cl.
*H01L 27/108* (2006.01)
*H01L 29/423* (2006.01)
*H01L 29/49* (2006.01)
*H01L 29/51* (2006.01)

(52) U.S. Cl.
CPC .... *H01L 27/10885* (2013.01); *H01L 27/10814* (2013.01); *H01L 27/10823* (2013.01); *H01L 27/10876* (2013.01); *H01L 27/10891* (2013.01); *H01L 29/4236* (2013.01); *H01L 29/4966* (2013.01); *H01L 29/517* (2013.01)

(58) Field of Classification Search
CPC .................. H01L 27/10805; H01L 27/10808; H01L 27/10814; H01L 27/10823; H01L 27/10885; H01L 27/10888
See application file for complete search history.

(56) References Cited

U.S. PATENT DOCUMENTS

| | | | |
|---|---|---|---|
| 6,440,791 B1 * | 8/2002 | Gau | 438/239 |
| 7,544,545 B2 * | 6/2009 | Chen | H01L 27/0629 257/E21.355 |
| 7,867,851 B2 * | 1/2011 | Hanson | H01L 21/26513 257/E21.428 |
| 7,888,720 B2 | 2/2011 | Seo et al. | |
| 2001/0025973 A1 * | 10/2001 | Yamada et al. | 257/296 |
| 2008/0277795 A1 * | 11/2008 | Kim | H01L 27/0207 257/758 |
| 2009/0072289 A1 * | 3/2009 | Kim et al. | 257/298 |
| 2010/0102371 A1 * | 4/2010 | Yeom | 257/296 |
| 2010/0148228 A1 * | 6/2010 | Cho et al. | 257/288 |
| 2013/0043529 A1 * | 2/2013 | Jang | H01L 27/10876 257/334 |

FOREIGN PATENT DOCUMENTS

| | | |
|---|---|---|
| KR | 10-0810616 B1 | 2/2008 |
| KR | 10-2010-0127478 A | 12/2010 |

* cited by examiner

*Primary Examiner* — Eduardo A Rodela

(57) ABSTRACT

A semiconductor device having a buried gate is provided. The semiconductor device is formed in a structure in which a plurality of contacts having small step differences are stacked without forming a metal contact applying an operation voltage to the buried gate in a single contact and a contact pad is formed between the contacts so that failure due to misalignment can be prevented without a separate additional process for forming the contacts.

13 Claims, 7 Drawing Sheets

SEMICONDUCTOR DEVICE AND METHOD OF MANUFACTURING THE SAME

CROSS-REFERENCES TO RELATED APPLICATION

The present application is a divisional of U.S. patent application Ser. No. 13/346,829, filed on Jan. 10, 2012, which claims priority to Korean Patent Application No. 10-2011-0044205 filed on 11 May 2011, which are incorporated by reference in their entirety.

BACKGROUND OF THE INVENTION

1. Technical Field

The present invention relates to a semiconductor device having a buried gate, and more particularly, to a semiconductor device and a method of manufacturing the same, which is capable of forming a metal contact that applies a voltage to a buried gate without a separate additional process and preventing failure due to misalignment in forming a contact.

2. Related Art

A dynamic random access memory (DRAM) of semiconductor devices includes a plurality of unit cells constituting of a capacitor and a transistor. The capacitor is used to store data and the transistor is used to transfer data between the capacitor and a bit line in response to a control signal (a word line) using a semiconductor property in which electrical conductivity changes according to the environment. The transistor is constituted of three parts, that is, a gate, a source and a drain. Charges move between the source and the drain according to the control signal. The charges move between the source and the drain through a channel region using the semiconductor property.

When a conventional transistor is fabricated on a semiconductor substrate, the gate is formed on the semiconductor substrate and then the source and drain are formed by implanting impurities into the semiconductor substrate, thereby forming the channel region between the source and drain below the gate. The transistor having such a horizontal channel region occupies an area of the semiconductor substrate. Since a complicated semiconductor memory device includes a plurality of transistors therein, it is difficult to reduce the total area thereof.

When the unit cell area of the semiconductor memory device is reduced, the number of semiconductor memory devices producible per a wafer increases and productivity can be improved. Various methods of reducing the unit cell area of the semiconductor memory device have been suggested. One of the various methods is using a transistor with a recessed gate, which is formed in a recess formed in a semiconductor substrate, so that a channel region is formed along a contour of the recess. Furthermore, a transistor with a buried gate, which is formed to be entirely buried within a recess, has been studied.

However, when the gate is formed as a buried type, since a step difference between a metal line (MO) and the gate increases, misalignment is likely to occur when a contact is formed to connect the metal line and the gate. The metal contact (MOC) is designed to apply a voltage to the gate. Linewidth of the gate is reduced as the semiconductor device becomes more highly integrated. As a result, misalignment is more likely to occur. When misalignment of the metal line occurs, the contact attacks the device isolation layer and comes in contact with the semiconductor substrate below the device isolation layer. Thereby, a signal (power) to be transferred to the gate is transmitted to the substrate, causing the device to fail.

SUMMARY

The present invention is directed to providing a semiconductor device and a method manufacturing the same, capable of simplifying a manufacturing process of the semiconductor device and preventing failure due to misalignment in forming a contact by improving a structure and a method of a metal contact applying an operation voltage to a buried gate in a pad area.

According to one aspect of an exemplary embodiment, a semiconductor device includes a lower gate contact formed in a pad area to be coupled to a buried gate in a cell area, a gate contact pad coupled to the lower gate contact and having a larger cross-sectional area than the lower gate contact, and an upper gate contact coupled to the gate contact pad and configured to coupled the gate contact pad and a metal line.

The lower gate contact may be simultaneously formed when a bit line contact is formed in a cell area and the gate contact pad may be simultaneously formed when a bit line is formed in the cell area. The upper gate contact may be simultaneously formed when a metal contact coupling the metal line and a bit line is formed.

The buried gate may have substantially the same linewidth both in the cell area and in the pad area.

According to another aspect of an exemplary embodiment, a method of manufacturing a semiconductor device includes forming a buried gate in a cell area and a pad area, forming a lower gate contact coupled to the buried gate in the pad area, forming a gate contact pad coupled to the lower gate contact, and forming an upper gate contact coupled to the gate contact pad.

The lower gate contact may be simultaneously formed when a bit line contact is formed in the cell area and the gate contact pad may be simultaneously formed when a bit line is formed in the cell area. The upper gate contact may be simultaneously formed when a metal contact coupling a metal line and a bit line is formed.

The buried gate may have substantially the same linewidth both in the cell area and in the pad area.

According to another aspect of an exemplary embodiment, a method of manufacturing a semiconductor device includes forming a device isolation layer defining an active region, forming a trench defining a gate region by etching the active region and the device isolation layer, forming a buried gate in a lower portion of the trench, forming an insulating layer over the buried gate in the trench, forming a first conductive layer over the insulating layer, selectively etching the conductive layer to form a bit line contact in a cell area and to form a lower gate contact coupled to the buried gate in a gate pad area, forming a bit line coupled to the bit line contact and forming a gate contact pad coupled to the lower gate contact, and forming a metal contact pattern coupled to the bit line in a bit line pad area and forming an upper gate contact pattern coupled to the gate contact pad.

The forming the bit line contact and the lower gate contact may include etching the insulating layer to form a bit line contact hole exposing the active region in the cell area and to form a lower gate contact hole exposing the buried gate in the gate pad area and to fill a conductive material in the lower gate contact hole and the bit line contact hole.

The forming the bit line and the gate contact pad may include forming a second conductive layer and a hard mask layer in the cell area and the gate pad area and patterning the second conductive layer and the hard mask layer to form a bit line stack in the cell area and to form a gate contact pad stack in the gate pad area.

The method may further include forming a gate lower electrode layer in a peripheral circuit area before the forming the second conductive layer and the hard mask layer.

The forming the second conductive layer and the hard mask layer in the cell area and the pad area may include forming the second conductive layer and the hard mask layer over the gate lower electrode layer. The patterning the second conductive layer and the hard mask layer in the cell area and the gate pad area may include forming a gate stack by patterning the second conductive layer, the hard mask layer, and the gate lower electrode layer in the peripheral circuit area.

The forming the metal contact and the upper gate contact may include forming an interlayer insulating layer over the bit line stack and the gate contact pad stack, etching the interlayer insulating layer and hard mask layer to form a metal contact hole in the bit line pad area and to form an upper gate contact hole in the gate pad area, and filling a conductive material in the metal contact hole and the upper gate contact hole.

These and other features, aspects, and embodiments are described below in the section entitled "DESCRIPTION OF EXEMPLARY EMBODIMENT."

BRIEF DESCRIPTION OF THE DRAWINGS

The above and other aspects, features, and other advantages of the subject matter of the present disclosure will be more clearly understood from the following detailed description taken in conjunction with the accompanying drawings, in which.

DESCRIPTION OF EXEMPLARY EMBODIMENT

Figure 1:
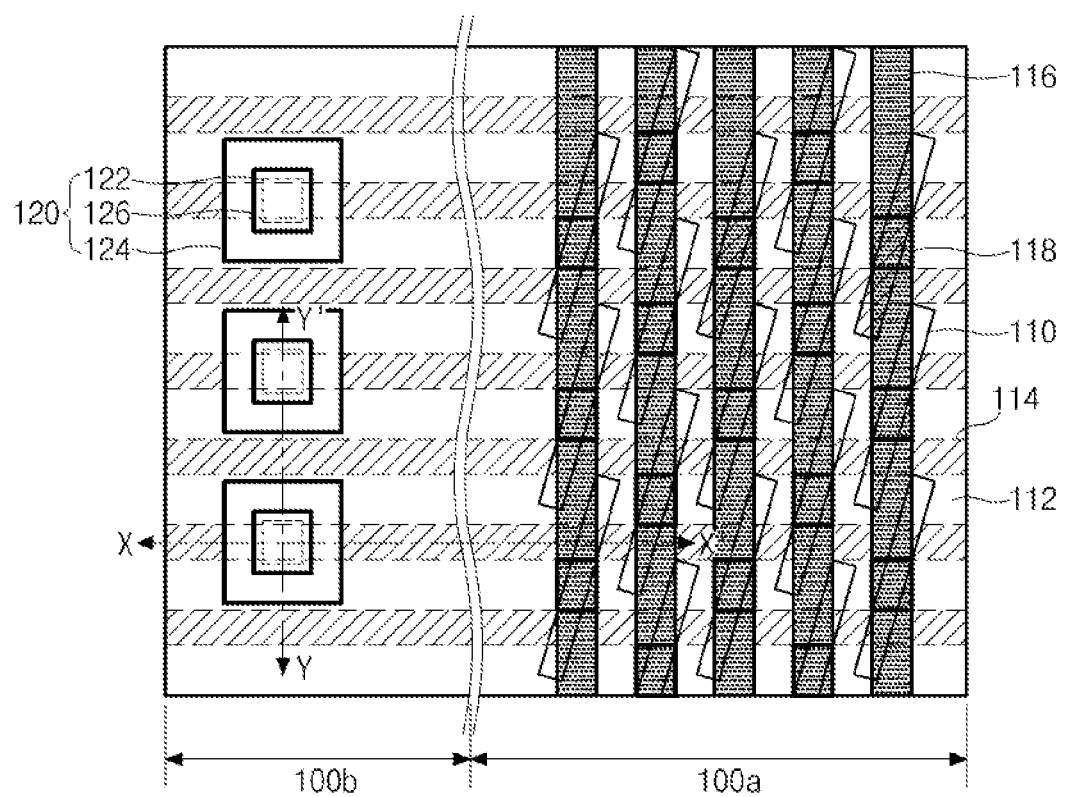
FIG. 1 is a plan view illustrating a structure of a semiconductor device according to an exemplary embodiment of the present invention.

Exemplary embodiments are described herein with reference to illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein, but may include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other layer or substrate, or intervening layers may also be present.

Hereinafter, a semiconductor device and a method of manufacturing the same according to an exemplary embodiment of the present invention will be described in detail with reference to accompanying drawings.

Figure 2:
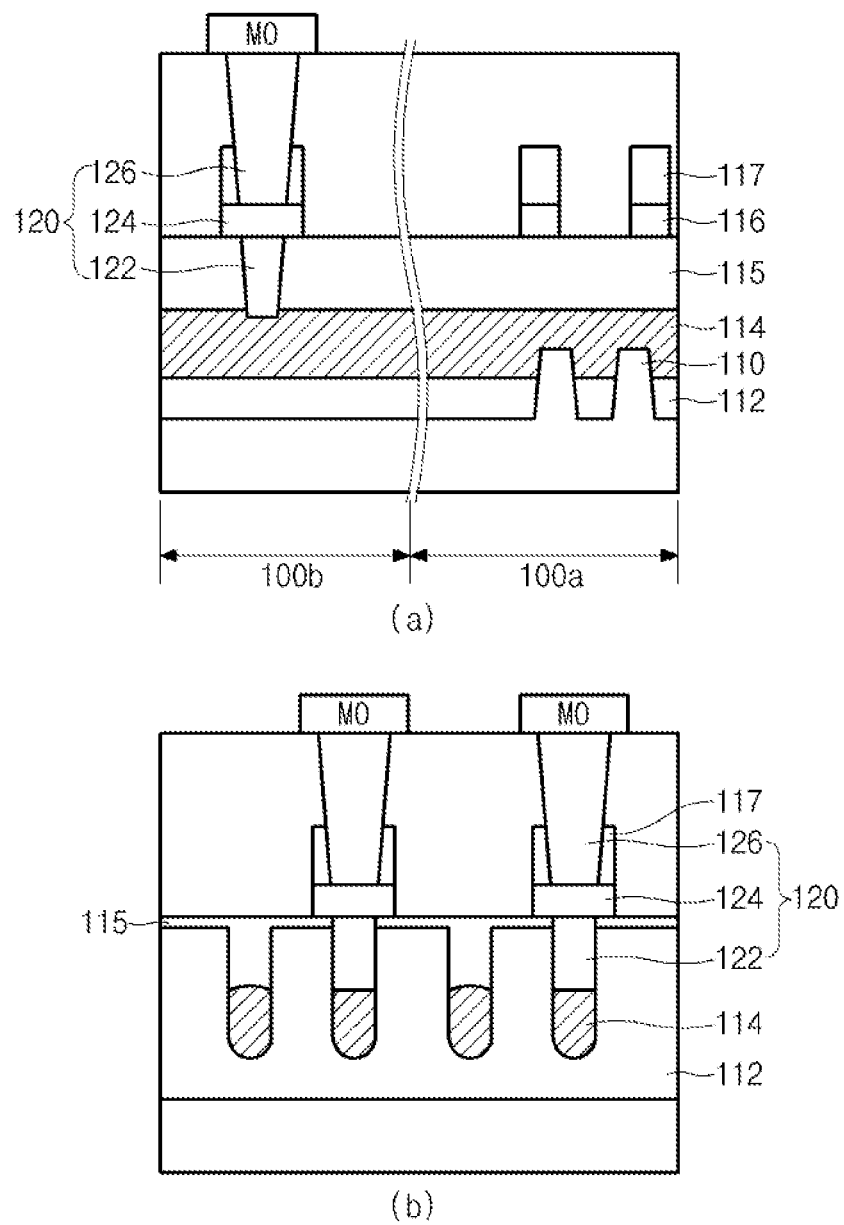
FIG. 2 is a cross-section view of the semiconductor device of FIG. 1, wherein (a) is a cross-sectional view taken along the line X-X' of FIG. 1 and (b) is a cross-sectional view taken along the line Y-Y' of FIG. 1.

FIG. 1 is a plan view illustrating a structure of a semiconductor device according to an exemplary embodiment of the present invention. FIG. 1 illustrates a cell area 100a and a pad area 100b of a cell mat (MAT). FIG. 2 is a cross-section view of FIG. 1, wherein (a) is a cross-sectional view taken along the line X-X' of FIG. 1 and (b) is a cross-sectional view taken along the line Y-Y' of FIG. 1.

An exemplary embodiment illustrates a semiconductor device having a layout of $6F^2$ as an example.

Referring to FIGS. 1 and 2, in a semiconductor device according to an embodiment of the present invention, the cell mat (MAT) includes the cell area 100a, in which a cell array is formed, and a pad area 100b, through which an operation voltage (gate voltage) is applied to a buried gate 114 via a metal line MO and a metal contact (MOC) 120.

The cell area 100a includes active regions 110, which are defined by a device isolation layer 112, and in which cell transistors are formed are diagonally formed. In the active region 110 and the device isolation layer 112, line type buried gates 114 are formed at an angle, with respect to the active region 110. For example, line type buried gates 114 may form an obtuse angle with respect to the active region 110 in a $6F^2$ layout.

Referring to FIG. 2, an insulating layer 115 is formed over the whole surface of a semiconductor substrate 100 including an upper surface of the buried gate 114. The insulating layer 115 may be formed of a stacking structure of a nitride layer (sealing nitride layer) and an oxide layer (for example, tetra ethyl ortho silicate (TEOS)).

In the cell area 100a, a bit line stack, in which a bit line 116 and a hard mask pattern (nitride layer) 117 are stacked, is formed on the insulating layer 115. Referring to FIG. 1, the bit line 116 is arranged across the buried gate 114 and across the active region 110. For example, the bit line 116 may form an acute angle with respect to the active region 110 in a $6F^2$ layout.

In the pad area 100b of the semiconductor substrate 100, the buried gate 114 is formed in the device isolation layer 112 while extending from the cell area 100a. The buried gate 114 is formed to have substantially the same linewidth both in the cell area 100a and the pad area 100b. That is, the buried gate 114 formed in the pad area 100b is not formed in a pad type, but is formed in a line type having the same linewidth as that of the buried layer 114 formed in the cell area 100a. The buried gate 114 is connected to the metal line MO through the gate metal contact 120.

The gate metal contact 120 includes a lower gate contact 122, a gate contact pad 124, and an upper gate contact 126. In the related art, the metal contact MOC connecting the buried gate and the metal line is formed by a single etching process, thus forming a single contact having a large step difference. However, in an embodiment of the present invention, the metal contact 120 is formed to have a structure in which a plurality of contacts 122 and 126 having low step differences are stacked. In an embodiment, to prevent misalignment between the lower gate contact 122 and the upper gate contact 126, the gate contact pad 124, which has a larger cross-sectional area than the lower gate contact 122, is formed on an upper surface of the lower gate contact 122. The lower gate contact 122, the gate contact pad 124, and the upper gate contact 126 can be formed when other elements of the semiconductor device are formed, so that an additional process for forming the gate metal contact 120 is not necessary. That is, when the metal contact is formed as a single contact directly connecting the metal line MO and the buried gate 114, as in the related art, a separate process for forming the metal contact is necessary. However, in an exemplary embodiment, the lower gate contact 122 is simultaneously formed when a bit line contact 118 is formed in the cell area 100a. The gate contact pad 124 is simultaneously formed when the bit line 116 in the cell area 100a and a gate (not shown) in a peripheral circuit area are formed. The upper gate contact 126 is simultaneously formed when the metal contact MOC 120 connecting the metal line MO and a bit line pad (not shown) is formed in a bit line pad area (not shown).

FIGS. 3 to 7 are cross-sectional views illustrating a process of manufacturing the structure of a semiconductor device according to an exemplary embodiment of the present invention as illustrated in FIG. 2, wherein (a) is a cross-sectional view taken along the line X-X' of FIG. 1 and (b) is a cross-sectional view taken along the line Y-Y' of FIG. 1.

Figure 3:
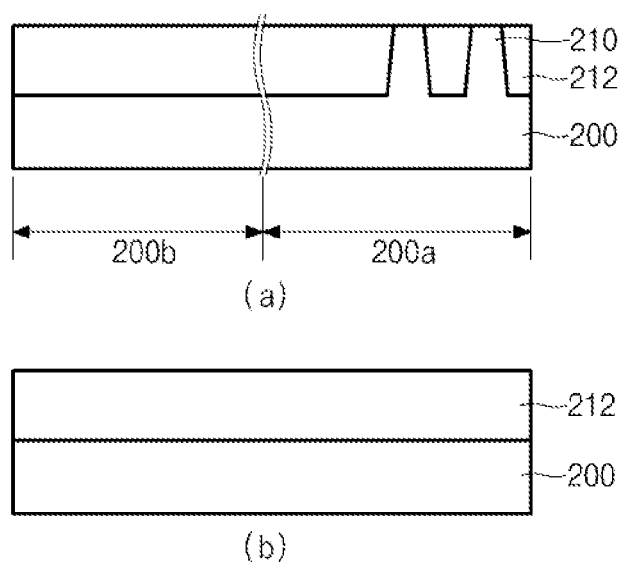
FIGS. 3 to 7 are cross-sectional views illustrating a process of manufacturing the semiconductor device of FIG. 2 according to an exemplary embodiment of the present invention, wherein, respectively, (a) is a cross-sectional view taken along the line X-X' of FIG. 1, and respectively, (b) is a cross-sectional view taken along the line Y-Y' of FIG. 1.

First, referring to FIG. 3, a pad oxide layer (not shown) and a pad nitride layer (not shown) are formed on a semiconductor substrate 200 and a photoresist layer (not shown) is formed on the pad nitride layer. In an embodiment, the pad oxide layer alleviates stress imposed by the pad nitride layer onto the semiconductor substrate 200.

Subsequently, an expose and develop process is performed using the photoresist layer to form a photoresist pattern (not shown) defining an active region 210. The pad nitride layer, the pad oxide layer and the semiconductor substrate 200 in a device isolation region are sequentially etched using the photoresist pattern as an etch mask to form a trench (not shown), a pad nitride layer pattern (not shown), and a pad oxide layer pattern (not shown).

Next, an oxidation process is performed to form an oxide layer (not shown) on an inner wall of the trench. In an embodiment, the oxide layer is formed to prevent a lattice defect from occurring at an exposed surface of the semiconductor substrate 200 after the trench is formed.

A liner nitride layer (not shown) and a liner oxide layer (not shown) are formed on a sidewall of the trench. The liner nitride layer is formed to prevent an oxidation of the inner wall of the trench and to alleviate stress caused in a subsequent process. The liner oxide layer is formed to alleviate stress due to an insulating material for filling the trench or to solve non-uniformity due to a difference in a deposition rate of the semiconductor substrate exposed by the trench and the pad nitride layer pattern.

Next, an insulating material for device isolation is formed on the cell area 200a and the pad area 200b to fill the trench. The insulating material for device isolation may be formed of an oxide layer. For example, the insulating material for device isolation may include a silicon on dielectric (SOD) layer or a high density plasma (HDP) oxide layer.

Next, a chemical mechanical polishing (CMP) process for the insulating material for device isolation is performed until the pad nitride layer pattern is exposed to planarize the insulating material for device isolation, thereby forming the device isolation layer 212 defining the active region 210.

Figure 4:
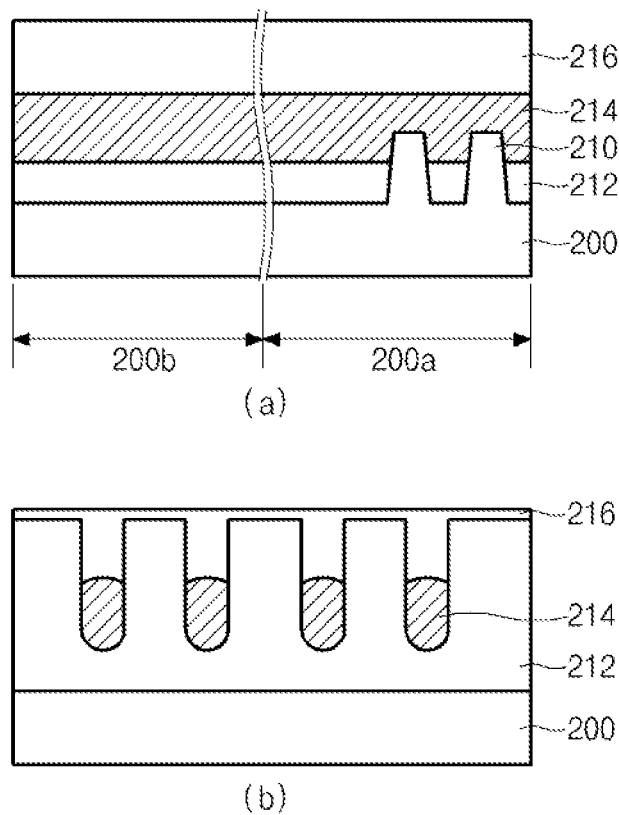

Referring to FIG. 4, the pad nitride layer pattern is removed and a gate pad oxide layer (not shown) and a hard mask layer (not shown) are formed on the active region 210 and the device isolation layer 212. The hard mask layer may be formed of a stacking layer of a nitride layer, an amorphous carbon layer (ACL) and a silicon oxynitride (SiON) layer.

A photoresist layer (not shown) is formed on the hard mask layer and an expose and develop process is performed to form a photoresist pattern (not shown) defining a buried gate region. The hard mask layer is etched using the photoresist pattern as an etch mask to form a hard mask pattern and the active region 210 and the device isolation layer 212 are etched using the hard mask pattern as an etch mask to form a trench.

A gate oxide layer (not shown) is formed on a surface of the semiconductor substrate 200 exposed by the trench. The gate oxide layer protects a surface of the silicon-based semiconductor substrate 200 and may be formed by depositing a high-k material such as silicon oxide (SiO), oxide/nitride/oxide (ONO), hafnium oxide ($HfO^2$), zirconium oxide (ZrO), or a Lead Zirconate Titanate (PZT) material through a chemical vapor deposition (CVD) method or a method of heating the semiconductor substrate 200 in a furnace. Alternatively, the gate oxide layer may be formed by depositing and naturally oxidizing a high-k material, such as zirconium (Zr) or hafnium (Hf), on a surface of the trench using an atomic layer deposition (ALD) process.

A gate electrode material is buried within the trench in which the gate oxide layer is formed and then etched back so that the gate electrode material remains in a lower portion of the trench to form a buried gate 214. The gate electrode material may include metal such as, for example, any one selected from the group consisting of titanium nitride (TiN), TiN/tungsten (W), and a combination thereof.

Subsequently, an insulating layer 216 is formed on the buried gate 214 to fill the trench. The insulating layer 216 may be formed of a stacking structure of a nitride layer (sealing nitride layer) and an oxide layer (TEOS).

Figure 5:
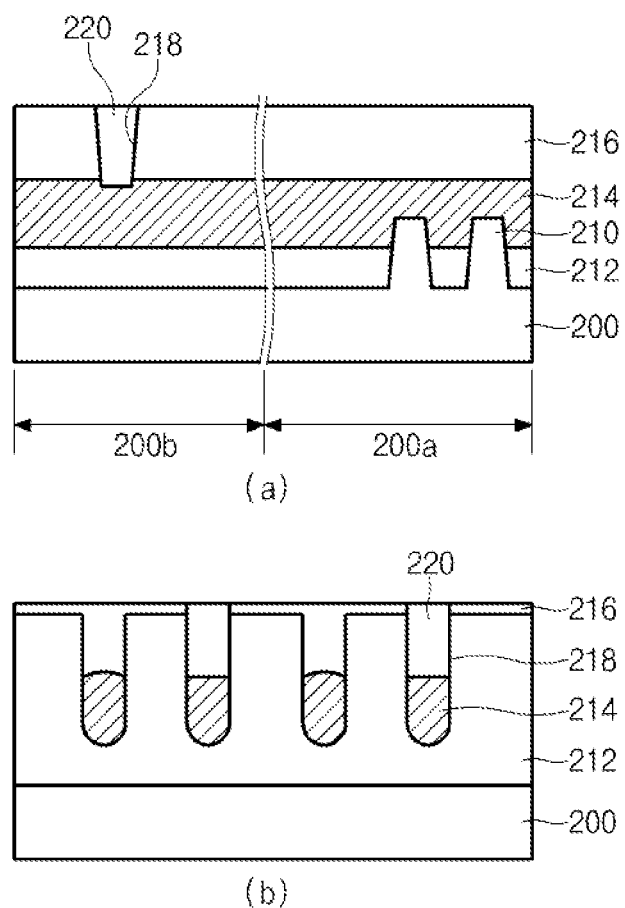

Referring to FIG. 5, a hard mask layer (not shown) is formed on the insulating layer 216. A photoresist pattern (not shown), defining the bit line contact region (118 of FIG. 1) of the cell area 200a and the lower gate contact region (122 of FIG. 1) of the pad area 200b, is formed on the hard mask layer. The hard mask layer is etched using the photoresist pattern as an etch mask to form a hard mask pattern. The insulating layer 216 is etched using the hard mask pattern to form a bit line contact hole (not shown) in the cell region 200a and a lower gate contact hole 218 in the pad region 200b. That is, the insulating layer 216 in the cell area 200a is etched until the substrate in the active region 210 between the buried gates 214 is exposed to form the bit line contact hole and the insulating layer 216 in the pad area 200b is etched until the buried gate 214 is exposed to form the lower gate contact hole 218. Then, the hard mask pattern is removed.

Impurities are implanted into the active region 210 exposed by the bit line contact hole to form a bit line junction region. Next, a conductive material is formed to fill the bit line contact hole and the lower gate contact hole 218 and planarized to form a bit line contact (not shown) and a lower gate contact 220. That is, in an exemplary embodiment, the lower gate contact 220 of the pad area 200b and the bit line contact of the cell area 200a are simultaneously formed.

Subsequently, a lower gate electrode layer (not shown) at the same level as the bit line contact is formed in the peripheral circuit area.

A conductive material for forming the bit line contact and the lower gate contact 220 may include a polysilicon layer.

Figure 6:
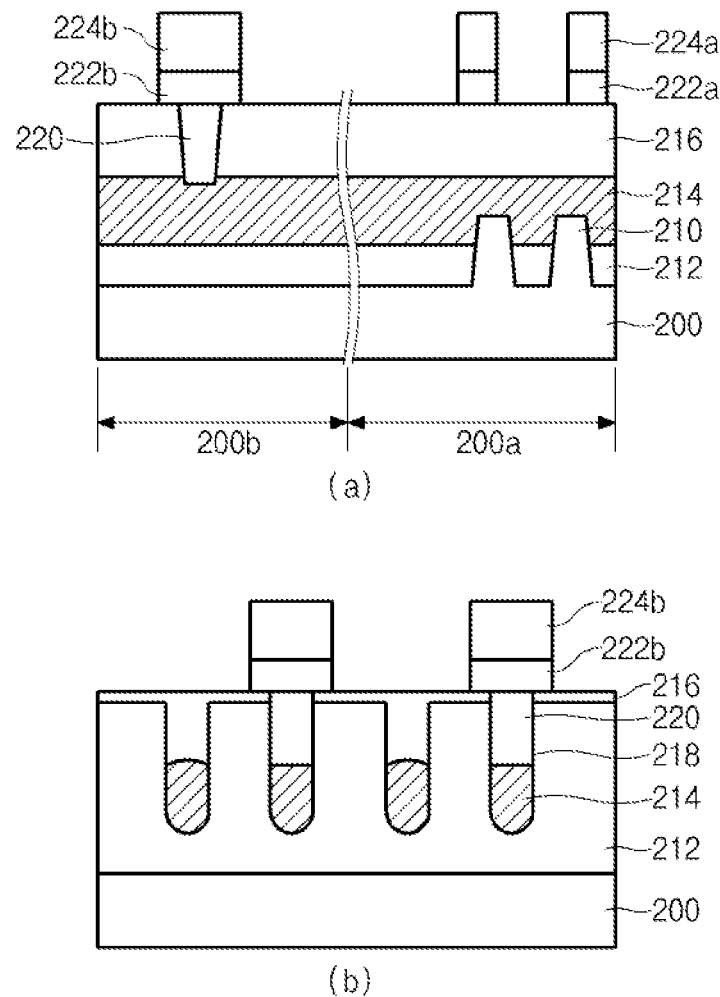

Referring to FIG. 6, a metal layer (not shown) and a hard mask layer (not shown) are formed in the cell area 200a and the pad area 200b. They are then patterned to form a bit line stack, in which a bit line 222a and a hard mask pattern 224b are stacked, in the cell area 200a, and a gate contact pad stack, in which a gate contact pad 222b and a hard mask pattern 224b are stacked, in the pad area 200b. That is, in an exemplary embodiment, the gate contact pad 222b of the pad area 200b and the bit line 222a of the cell area 200a are simultaneously formed.

When the bit line stack and the gate contact pad stack are formed in the cell area 200a and the pad area 200b, a peri-gate stack is also formed in a peripheral circuit area. That is, when the metal layer (not shown) and the hard mask layer (not shown) are formed in the cell area 200a and the pad area 200b, the metal layer (not shown) and the hard mask pattern layer (not shown) are simultaneously formed in the peripheral circuit area. When the bit line stack and the gate contact pad stack are patterned, the hard mask layer and the metal layer (upper electrode) in the peripheral circuit area may be also patterned to form the peri-gate stack in the peripheral circuit area.

The metal layer may include TiN, TiN/W, or a combination thereof.

Figure 7:
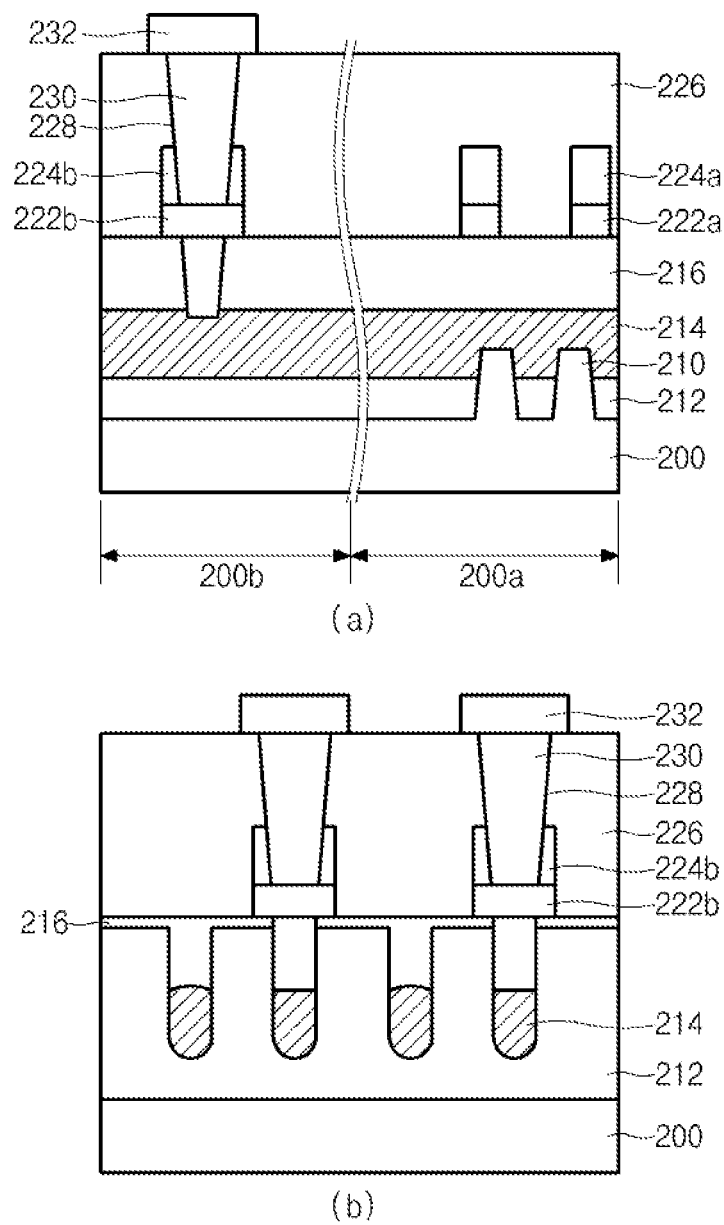

Referring to FIG. 7, an interlayer insulating layer 226 is formed on the whole surface of the semiconductor substrate 200 including the cell area 200a and the pad area 200b. Subsequently, a photoresist pattern for defining a metal contact region connecting a metal line (MO) and a bit line pad (not shown) in a bit line pad area (not shown) and further defining an upper gate contact region connecting the metal line (MO) and the gate contact pad 222b in the pad area 200b is formed on the interlayer insulating layer 226.

Next, the interlayer insulating layer 226 and the hard mask patterns 224a and 224b are etched using the photoresist pattern to form an upper gate contact hole 228 and a metal contact hole (not shown) in the pad area 200b and the bit line pad area (not shown), respectively.

A conductive material is formed to fill the upper gate contact hole 228 and the metal contact hole and planarized to form an upper gate contact 230 and the metal contact (not shown). That is, in an exemplary embodiment, the upper gate contact 230 is simultaneously formed with a conventional bit line metal contact so that a separate process is not necessary.

A metal layer is formed on the interlayer insulating layer 226 including, the upper gate contact 230, and the bit line metal contact (not shown), and then patterned to form metal lines (MOs) connected to the upper gate contact 230 and the metal contact, respectively. The metal line (MO) 232, connected to the upper gate contact 230, is connected a sub word line driver (SWD) (not shown) of a core area, and the metal line, connected to the bit line metal contact, is connected to a sense amplifier (not shown) of the core area.

According to an exemplary embodiment, a metal contact applying an operation power to a buried gate can be formed without a separate process and failure due to misalignment of a contact can be prevented.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A method of manufacturing a semiconductor device, comprising:
forming a buried gate in a cell area and a pad area;
forming a lower gate contact coupled to the buried gate in the pad area;
forming a bit line and a gate contact pad simultaneously by etching a metal layer deposited over the lower gate contact, wherein the gate contact pad is coupled to the lower gate contact; and
forming an upper gate contact coupled to the gate contact pad,
wherein the lower gate contact, the gate contact pad, and the upper gate contact form a gate metal contact.

2. The method of claim 1, wherein the buried gate is formed in a line type having substantially the same linewidth both in the cell area and in the pad area.

3. The method of claim 1, wherein the forming the lower gate contact includes simultaneously forming the lower gate contact when a bit line contact is formed in the cell area.

4. The method of claim 1, wherein the forming the bit line and the gate contact pad simultaneously includes forming the bit line in the cell area.

5. The method of claim 1, wherein the forming the upper gate contact includes simultaneously forming the upper gate contact when the metal contact coupling a metal line and a bit line is formed.

6. A method of manufacturing a semiconductor device, comprising:
forming a device isolation layer defining an active region;
forming a trench defining a gate region by etching the active region and the device isolation layer;
forming a buried gate in a lower portion of the trench;
forming an insulating layer over the buried gate in the trench;
forming a first conductive layer over the insulating layer
selectively etching the conductive layer to form a bit line contact in a cell area and to form a lower gate contact coupled to the buried gate in a pad area;
forming a bit line and a gate contact pad simultaneously by etching a metal layer deposited over the lower gate contact, wherein the bit line is coupled to the bit line contact and the gate contact pad is coupled to the lower gate contact; and
forming a metal contact pattern coupled to the bit line and forming an upper gate contact pattern coupled to the gate contact pad,
wherein the lower gate contact, the gate contact pad, and the upper gate contact form a gate metal contact.

7. The method of claim 6, wherein the step of forming the bit line contact and the lower gate contact includes:
etching the insulating layer to form a bit line contact hole exposing the active region in the cell area and to form a lower gate contact hole exposing the buried gate in the pad area; and
filling conductive material in the bit line contact hole and the lower gate contact hole.

8. The method of claim 6, wherein the step of forming the bit line and the gate contact pad includes:
forming a second conductive layer and a hard mask layer in the cell area and the pad area; and
patterning the second conductive layer and the hard mask layer to form a bit line stack in the cell area and to form a gate contact pad stack in the pad area.

9. The method of claim 8, the method further comprising:
before the forming the second conductive layer and the hard mask layer, forming a gate lower electrode layer in a peripheral circuit area.

10. The method of claim 9, wherein the forming the second conductive layer and the hard mask layer in the cell area and the pad area includes forming the second conductive layer and the hard mask layer over the gate lower electrode layer, and
wherein the patterning the second conductive layer and the hard mask layer in the cell area and the pad area includes patterning the second conductive layer, the hard mask layer, and the gate lower electrode layer in the peripheral circuit area to form a gate stack.

11. The method of claim 8, wherein the step of forming the metal contact and the upper gate contact includes:

forming an interlayer insulating layer over the bit line stack and the gate contact pad stack;

etching the interlayer insulating layer and hard mask layer to form a metal contact hole in the cell area and to form an upper gate contact hole in the pad area; and filling conductive material in the metal contact hole and the upper gate contact hole.

12. A method of manufacturing a semiconductor device, comprising:

forming a gate pattern extending from a cell area to a pad area;

forming a gate metal line in the pad area; and forming a gate pad pattern in the pad area to couple the gate pattern to the gate metal line, wherein the step of forming the gate pad pattern comprises:

forming a lower gate contact pattern coupled to the gate pattern;

forming an upper gate contact pattern coupled to the gate metal line; and forming a bit line and a gate contact pad simultaneously by etching a metal layer deposited over the lower gate contact pattern, wherein the gate contact pad is coupled to the lower gate contact pattern, wherein the gate contact pad has an area larger than the lower gate contact pattern, and wherein the lower gate contact pattern, the gate contact pad, and the upper gate contact pattern form a gate metal contact.

13. The method of claim 12, wherein the lower gate contact pattern is formed where a bit line contact pattern is formed in a cell area, the bit line contact pattern being coupled to the gate pattern in the cell area, wherein the gate contact pad is formed when a bit line is formed in a cell area, the bit line being coupled to the bit line contact pattern, and wherein the upper gate contact is formed when a bit line metal contact pattern is formed in the cell area, the bit line metal contact pattern being coupled to the bit line in the cell area.

* * * * *